(12) United States Patent
Huang et al.

(10) Patent No.: US 11,177,272 B2
(45) Date of Patent: Nov. 16, 2021

(54) THREE-DIMENSIONAL MEMORY DEVICE AND METHOD FOR MANUFACTURING THE SAME

(71) Applicant: Yangtze Memory Technologies Co., Ltd., Wuhan (CN)

(72) Inventors: Kai Jin Huang, Wuhan (CN); Jin Lyu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 15/930,458

(22) Filed: May 13, 2020

(65) Prior Publication Data

US 2021/0305272 A1 Sep. 30, 2021

Related U.S. Application Data

(63) Continuation of application No. PCT/CN2020/081059, filed on Mar. 25, 2020.

(51) Int. Cl.
| | |
|---|---|
| *H01L 27/11582* | (2017.01) |
| *H01L 27/11524* | (2017.01) |
| *H01L 27/11556* | (2017.01) |
| *H01L 21/768* | (2006.01) |
| *H01L 23/522* | (2006.01) |
| *H01L 23/532* | (2006.01) |
| *H01L 27/1157* | (2017.01) |

(52) U.S. Cl.
CPC .... *H01L 27/11582* (2013.01); *H01L 21/7682* (2013.01); *H01L 21/76877* (2013.01); *H01L 23/5226* (2013.01); *H01L 23/5329* (2013.01); *H01L 27/1157* (2013.01); *H01L 27/11524* (2013.01); *H01L 27/11556* (2013.01)

(58) Field of Classification Search
None
See application file for complete search history.

(56) References Cited

U.S. PATENT DOCUMENTS

| | | | |
|---|---|---|---|
| 9,905,569 B1 | 2/2018 | Kim | |
| 2012/0012920 A1 | 1/2012 | Shin | |
| 2015/0294980 A1 | 10/2015 | Lee | |
| 2015/0311209 A1 | 10/2015 | Whang | |
| 2016/0043093 A1* | 2/2016 | Lee | H01L 29/40114 257/314 |
| 2017/0062471 A1 | 3/2017 | Son | |
| 2017/0069637 A1* | 3/2017 | Son | H01L 27/11565 |
| 2017/0243879 A1 | 8/2017 | Yu | |
| 2018/0097009 A1 | 4/2018 | Zhang | |

FOREIGN PATENT DOCUMENTS

| | | |
|---|---|---|
| CN | 108886041 A | 11/2018 |
| CN | 109461740 A | 3/2019 |
| CN | 109791932 A | 5/2019 |
| TW | 201816938 A | 5/2018 |

\* cited by examiner

*Primary Examiner* — Hsien Ming Lee
(74) *Attorney, Agent, or Firm* — Winston Hsu (57) ABSTRACT

A three-dimensional (3D) memory device is provided and includes a substrate, an alternating stack and a channel structure. The alternating stack is disposed on the substrate, and the alternating stack includes a plurality of conductive layers and a plurality of air gap layers alternately stacked. The channel structure is disposed on the substrate and extends vertically through the conductive layers and the air gap layers. The alternating stack further includes a plurality of etching stop blocks between the air gap layers and the channel structure.

17 Claims, 11 Drawing Sheets

THREE-DIMENSIONAL MEMORY DEVICE AND METHOD FOR MANUFACTURING THE SAME

CROSS REFERENCE TO RELATED APPLICATIONS

This application is a continuation of International Application No. PCT/CN 2020/081059 filed on Mar. 25, 2020, the entire contents of which are incorporated herein by reference.

BACKGROUND OF THE INVENTION

1. Field of the Invention

The present invention relates to a three-dimensional (3D) memory device and a method for manufacturing the same.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array. As known in the art, 3D NAND is a flash memory technology which stacks memory cells vertically to increase capacity for higher storage density and lower cost per gigabyte. As 3D NAND technology is moving toward high density and high capacity, especially from 64-layer to 128-layer scheme, the number of memory cells needs to be increased. In order to have better etching of channel holes and controlled process cost, the thickness of each memory cell should be reduced. However, as the thickness of each memory cell is continuously thinned, the coupling between control gates of the adjacent memory cells is more serious, thereby resulting in larger RC delay in the memory device and interference between memory cells during programming operation.

SUMMARY OF THE INVENTION

Embodiments of three-dimensional (3D) memory device architectures and methods for manufacturing the same therefore are disclosed herein. The disclosed structures and methods provide numerous benefits, including, but not limited to easily controlling the process, decreasing coupling capacitance between control gates, and reducing RC delay of the 3D memory device during programming operation.

In some embodiments, a 3D memory device is disclosed. The 3D memory device includes a substrate, an alternating stack, and a channel structure. The alternating stack is disposed on the substrate, in which the alternating stack includes a plurality of conductive layers and a plurality of air gap layers alternately stacked. The channel structure is disposed on the substrate and extends vertically through the conductive layers and the air gap layers. The alternating stack further includes a plurality of etching stop blocks between the air gap layers and the channel structure.

In some embodiments, the alternating stack includes a channel hole extending vertically through the alternating stack, and the channel structure includes a blocking layer, a storage layer, a tunneling layer and a channel layer sequentially disposed on a sidewall of the channel hole.

In some embodiments, the channel structure further includes a filling layer disposed in the channel hole.

In some embodiments, the etching stop blocks and the blocking layer include different materials. In some embodiments, the blocking layer directly contacts the etching stop blocks. In some embodiment, the etching stop blocks include polysilicon.

In some embodiments, the 3D memory device further includes a slit structure extending vertically through the alternating stack, wherein the channel structure, the conductive layers and the slit structure seal the air gap layers. The slit structure includes an insulating layer and a contact, and the insulating layer is disposed between the contact and the alternating stack.

In some embodiments, a method for manufacturing a 3D memory device is disclosed. First, an alternating dielectric stack is formed on a substrate, in which the alternating dielectric stack includes a plurality of first dielectric layers and a plurality of second dielectric layers alternately stacked on the substrate, and the plurality of first dielectric layers and the plurality of second dielectric layers include different materials. Next, a channel hole is formed vertically through the alternating dielectric stack, and a plurality of recesses are formed laterally on a sidewall of the channel hole. Later, a plurality of etching stop blocks are formed in the recesses and followed by forming a channel structure in the channel hole and vertically through the alternating dielectric stack. The second dielectric layers are then replaced with a plurality of conductive layers. Subsequently, a plurality of air gap layers are formed, thereby forming an alternating stack, wherein the alternating stack includes the conductive layers and the air gap layers alternately stacked, and the air gap layers are formed at least by removing a part of each of the first dielectric layers.

In some embodiments, the etching stop blocks include a material different from the first dielectric layers and the second dielectric layers. In some embodiment, the etching stop blocks include polysilicon.

In some embodiments, forming the etching stop blocks includes forming an etching stop layer in the recesses, in which the etching stop layer extends on a sidewall of each of the second dielectric layers; and oxidizing the etching stop layer outside the recesses to form a blocking layer, in which remaining parts of the etching stop layer form the etching stop blocks.

In some embodiments, forming the channel structure includes forming a storage layer, a tunneling layer and a channel layer sequentially on the blocking layer.

In some embodiments, the etching stop layer and the conductive layers include different materials.

In some embodiments, forming the air gap layers includes removing the first dielectric layers. Forming the air gap layers further includes removing the etching stop blocks.

In some embodiments, the method further includes forming a slit vertically through the alternating dielectric stack, in which the second dielectric layers is replaced with the conductive layers through the slit.

In some embodiments, the method further includes forming an insulating layer in the slit to seal the air gap layers. The method further includes forming a contact in the slit, in which the insulating layer is disposed between the slit and the alternating stack.

In some embodiments, the method further includes forming a doped region in the substrate after forming the slit.

These and other objectives of the present invention will no doubt become obvious to those of ordinary skill in the art after reading the following detailed description of the preferred embodiment that is illustrated in the various figures and drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

As used throughout this application, the word "may" is used in a permissive sense (e.g., meaning having the potential to), rather than the mandatory sense (e.g., meaning must). The words "include", "including", and "includes" indicate open-ended relationships and therefore mean including, but not limited to. Similarly, the words "have", "having", and "has" also indicated open-ended relationships, and thus mean having, but not limited to. The terms "first", "second", "third," and so forth as used herein are meant as labels to distinguish among different elements and may not necessarily have an ordinal meaning according to their numerical designation.

In the present invention, different technical features in different embodiments described in the following description can be combined, replaced, or mixed with one another to constitute another embodiment.

Figure 1:
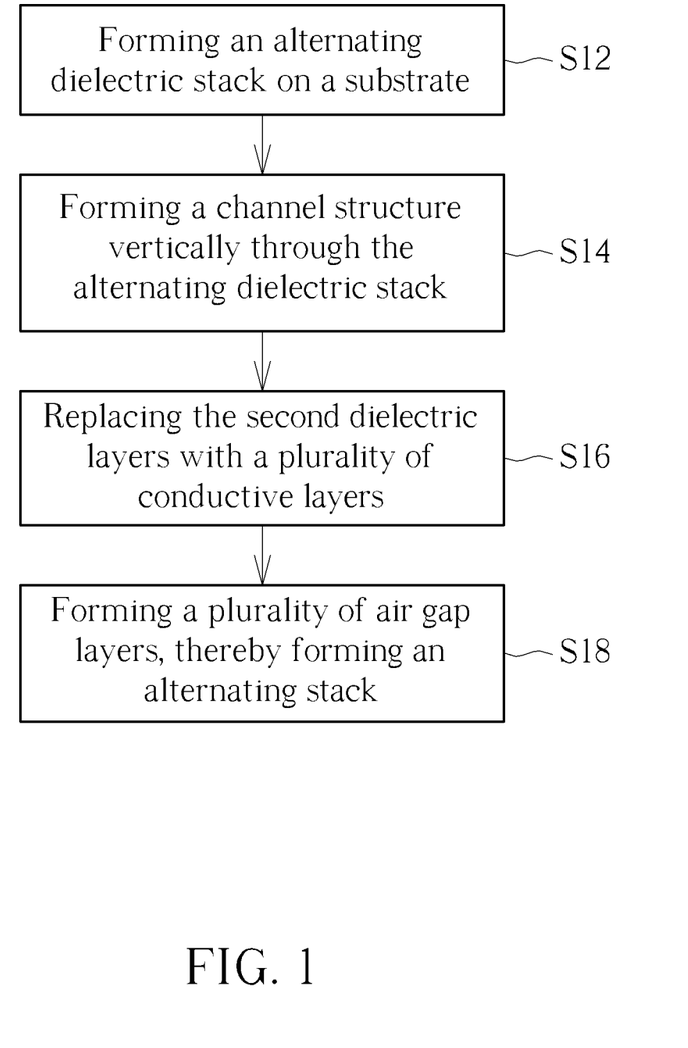
FIG. 1 schematically illustrates a flowchart of a method for manufacturing a three-dimensional (3D) memory device according an embodiment of the present invention.
Figure 8:
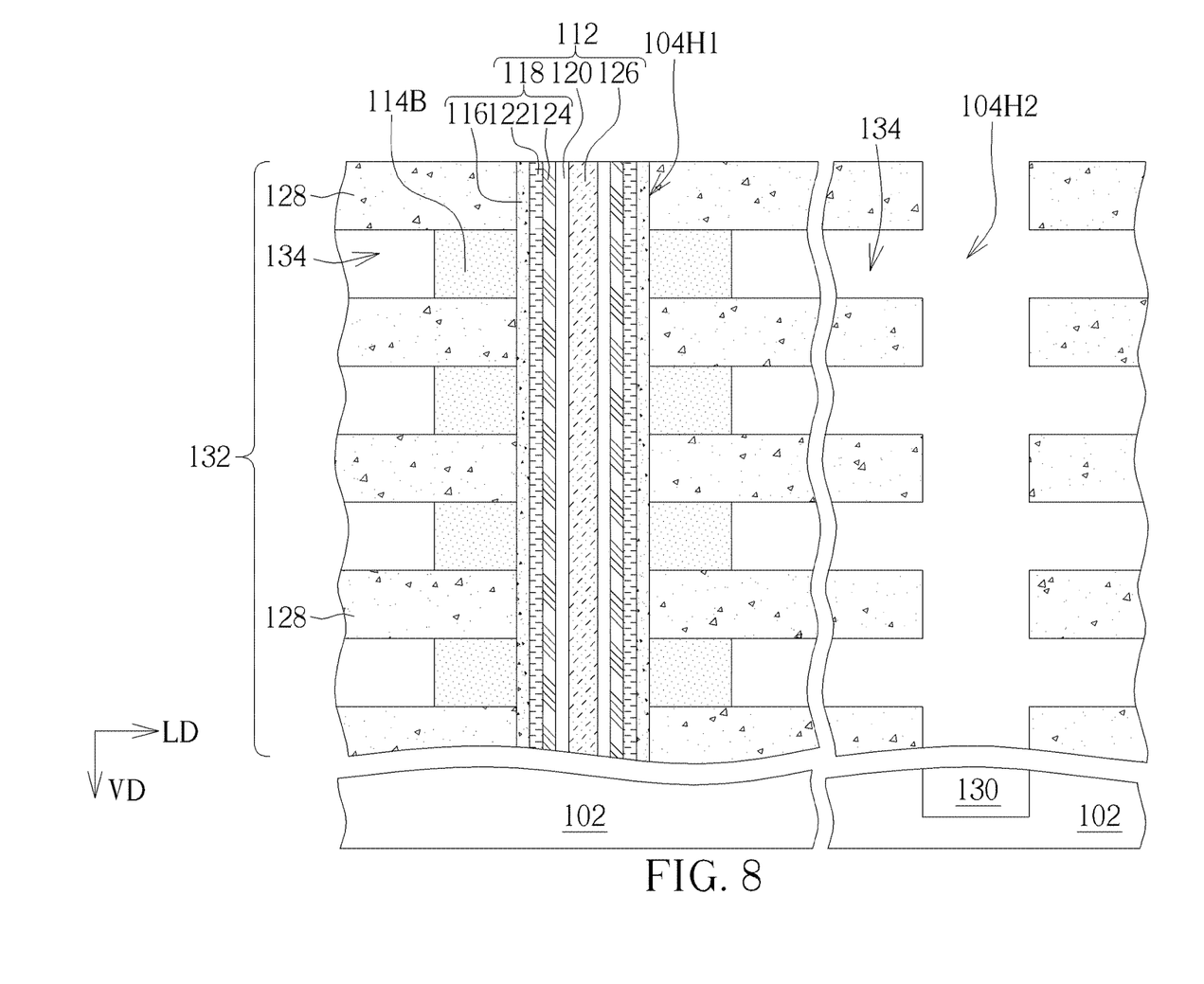
Figure 9:
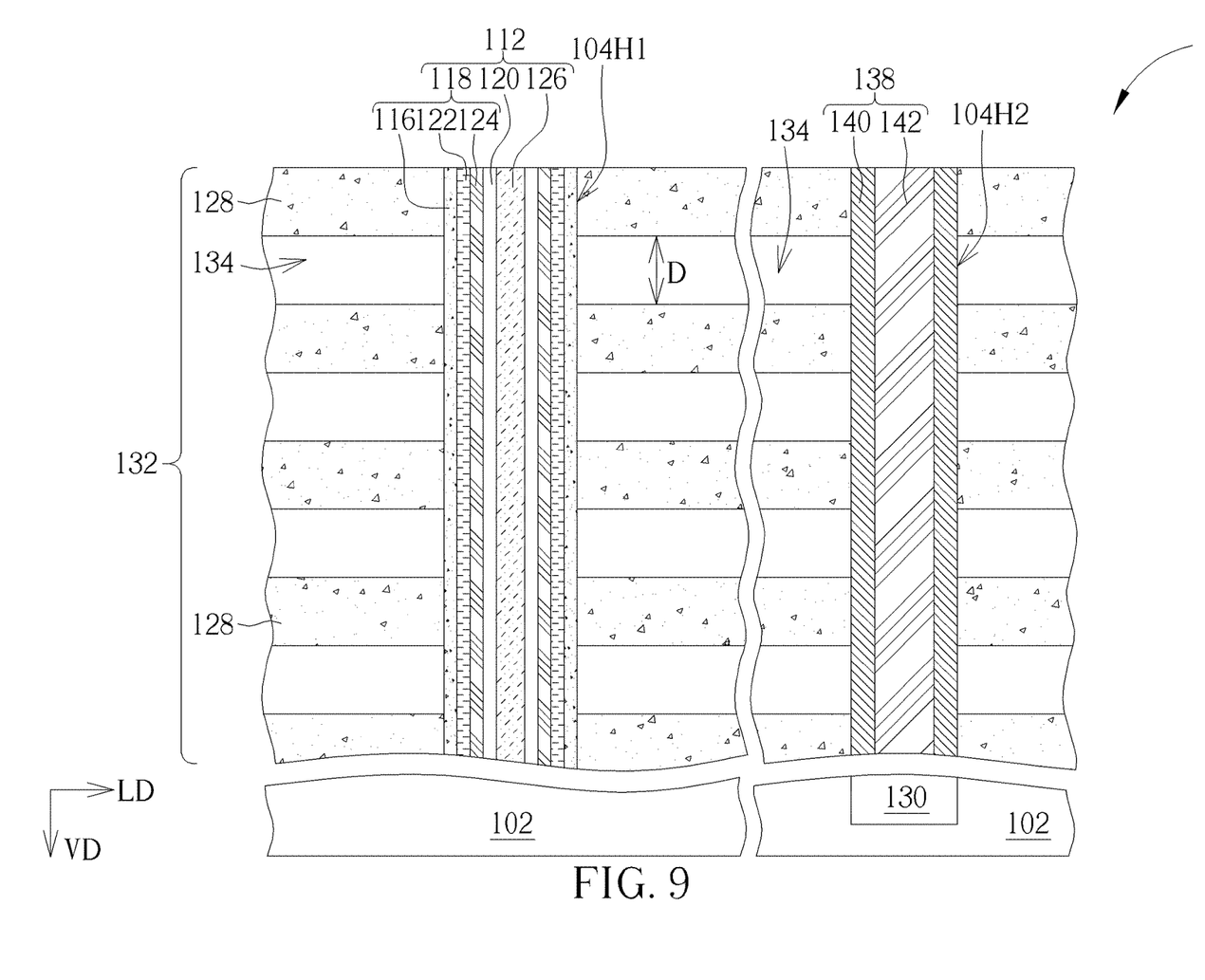

FIG. 1 schematically illustrates a flowchart of a method for manufacturing a three-dimensional (3D) memory device according an embodiment of the present invention. FIGS. 2-9 schematically illustrate sectional views of exemplary structures at different steps of the method shown in FIG. 1 according to an embodiment of the present invention, in which FIG. 9 schematically illustrates a sectional view of exemplary 3D memory device according to the first embodiment of the present invention. For clarity, FIGS. 2-9 only illustrate a part of the 3D memory device 1 instead of entire structure of the 3D memory device 1, and the present invention is not limited thereto. As shown in FIG. 1, the method for manufacturing the 3D memory device provided in this embodiment includes the following steps S12, S14, S16, S18, and is detailed accompanying with FIG. 1 as well as FIGS. 2-9. It should be understood that the steps shown in the method are not exhaustive and that other steps can be performed as well before, after, or between any of the illustrated steps.

Figure 2:
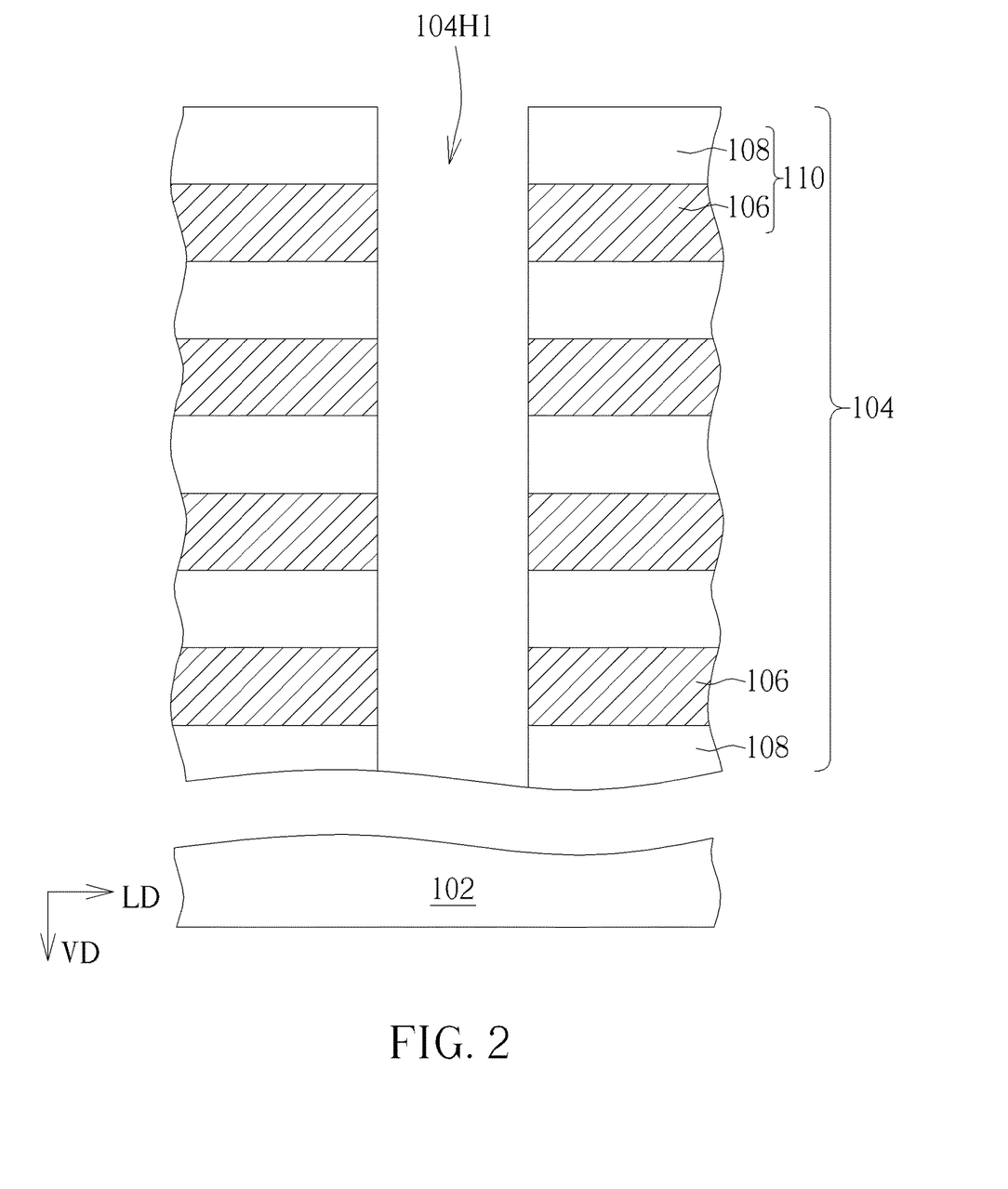
FIGS. 2-9 schematically illustrate sectional views of exemplary structures at different steps of the method shown in FIG. 1 according to an embodiment of the present invention.

As shown in FIG. 1 and FIG. 2, the method starts at step S12, in which an alternating dielectric stack 104 is formed on a substrate 102. Specifically, in step S12, the substrate 102 is provided first, and the alternating dielectric stack 104 is formed on the substrate 102. In some embodiments, the substrate 102 may include any semiconductor substrate including any suitable material for forming the three-dimensional memory device. For example, the substrate 102 can include silicon, silicon germanium, silicon carbide, silicon on insulator (SOI), germanium on insulator (GOI), glass, gallium nitride (GaN), gallium arsenide (GaAs), and/or other suitable III-V compound, but not limited thereto. In some embodiments, the substrate 102 may include any required doped region, but is not limited thereto.

As shown in FIG. 2, the alternating dielectric stack 104 may include a plurality of first dielectric layers 106 and a plurality of second dielectric layers 108 alternately stacked on the substrate 102. One of the first dielectric layers 106 and a corresponding one of the second dielectric layers 108 adjacent to each other may form a dielectric layer pair 110, in which the first dielectric layer 106 and the second dielectric layer 108 include different materials. For example, the first dielectric layer 106 may include silicon oxide, and the second dielectric layer 108 may include silicon nitride. The alternating dielectric stack 104 may be formed by one or more thin film deposition processes including, but not limited to, CVD, PVD, ALD, or any combination thereof.

In some embodiments, a staircase structure (not shown) may be formed at one or more edges of the alternating dielectric stack 104. For example, a trim-etch process can be performed on at least one side (in the lateral direction LD) of alternating dielectric stack 104 to form the staircase structure with multiple levels. Each level may include one or more dielectric layer pairs 110 with the first dielectric layer 106 and second dielectric layer 108 alternately stacked.

Figure 5:
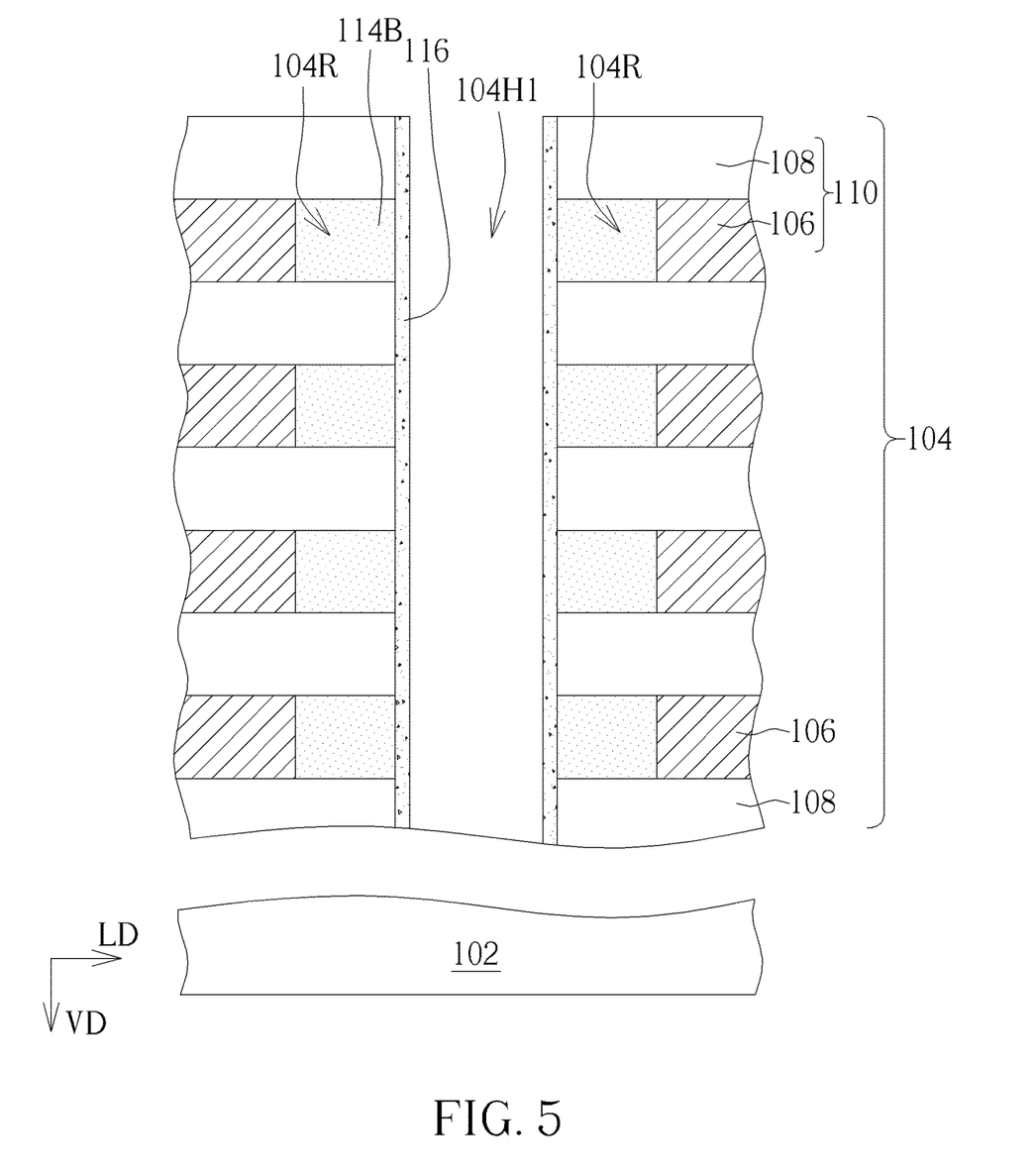
Figure 6:
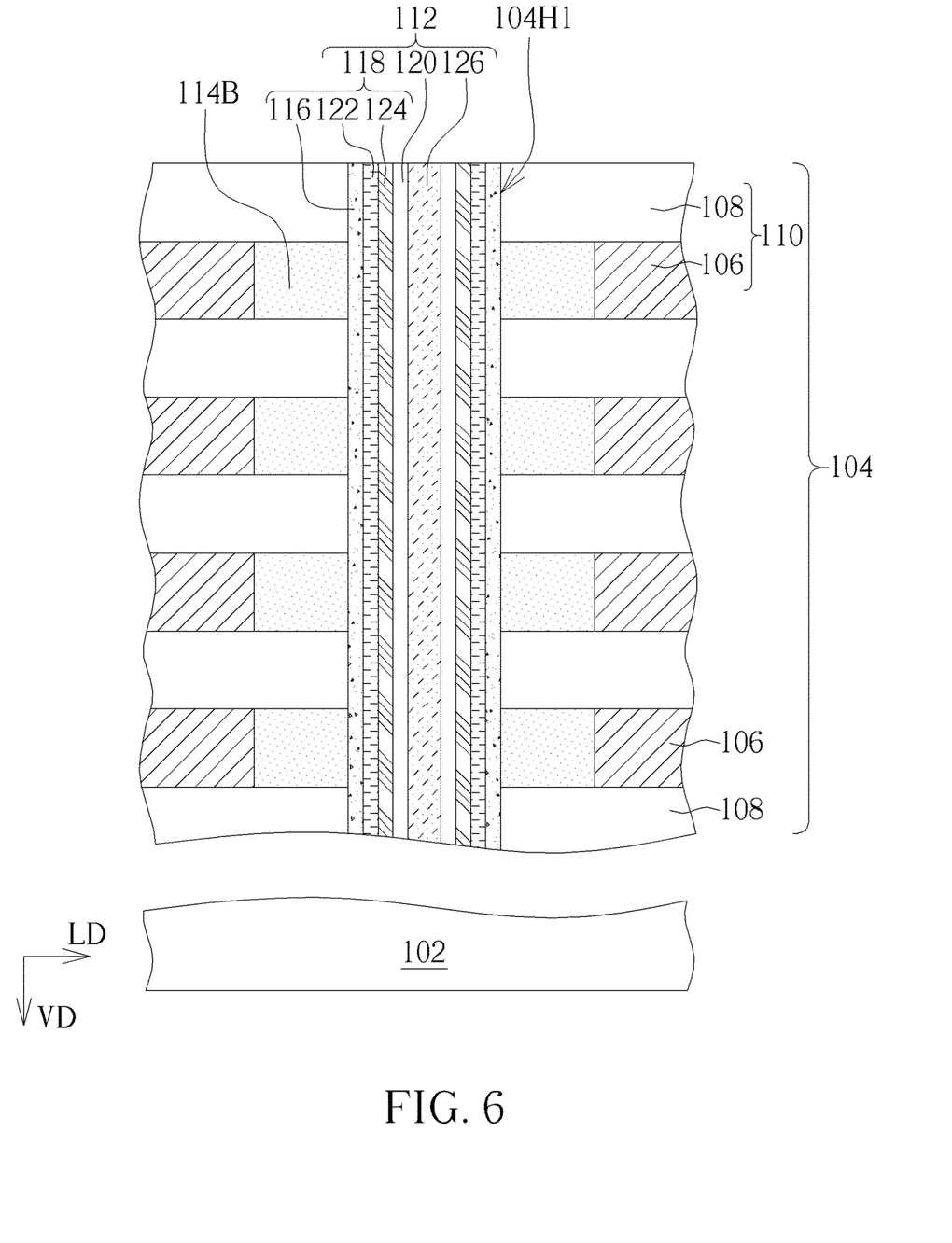

As shown in FIG. 1 and FIG. 6, the method proceeds to step S14, in which a channel structure 112 is formed vertically through the alternating dielectric stack 104. In this embodiment, the fabrication process to form the channel structure 112 may be detailed accompanying with FIGS. 2-6 in the following description.

Firstly, as shown in FIG. 2, a channel hole 104H1 that extends vertically through alternating dielectric stack 104 may be formed by, for example, wet etching and/or dry etching. For example, the channel hole 104H1 may extend along the vertical direction VD perpendicular to the substrate 102. In some embodiments, the etching rates of the etching process for forming the channel hole 104H1 to the first dielectric layers 106 and the second dielectric layers 108 may be substantially the same. In some embodiments, a top view shape of the channel hole 104H1 may be for example circular, rectangular or other suitable shape. In some embodiments, the number of the channel hole 104H1 may be plural. For clarity, the following description takes one channel hole 104H1 as an example, but is not limited thereto.

Figure 3:
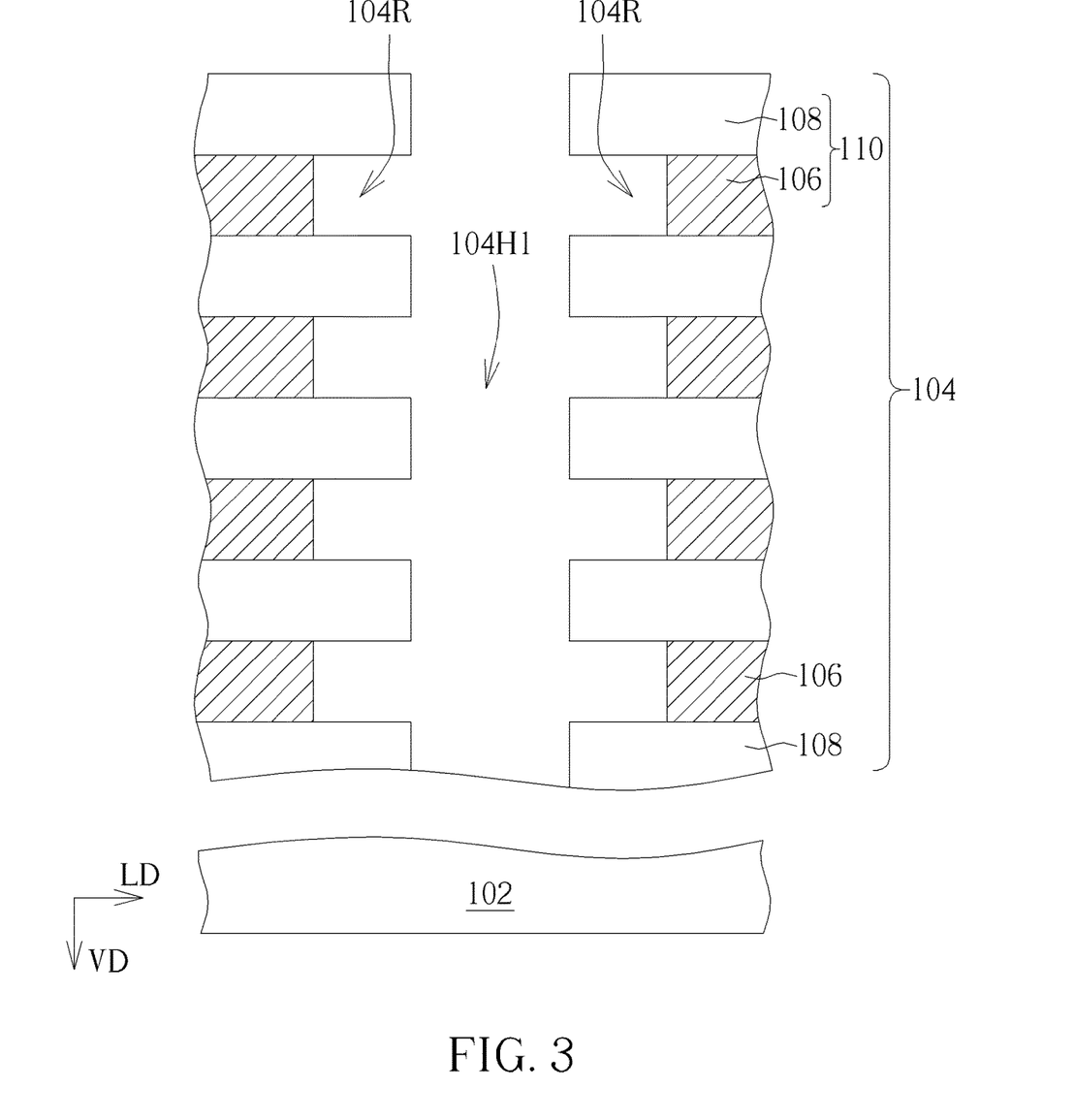

As shown in FIG. 3, after the channel hole 104H1 is formed, a plurality of recesses 104R may be laterally formed on the sidewall of the channel hole 104H1. In some embodiments, the etching process for forming the recesses 104R may selectively etching the first dielectric layers 106 relative to the second dielectric layers 108, such that one of the recesses 104R is between two of the second dielectric layers 108 adjacent to the recess 104R and laterally extends into a corresponding one of the first dielectric layers 106. Specifically, during the step of forming the recesses 104R, the etching process with high etching selectivity of the first dielectric layers 106 relative to the second dielectric layers 108 may be performed, such that the exposed sidewall of each of the first dielectric layer 106 is etched and recessed. The depth of the recess 104R in the lateral direction LD may be adjusted by controlling the etching conditions, such as etching duration, etching speed or etchant according to the requirements.

In some embodiments, a channel epitaxial layer (not shown in figures) may be formed at the bottom of the channel hole 104H1. The channel epitaxial layer may be formed by a suitable deposition process or a suitable epitaxial process. The channel epitaxial layer may include semiconductor material.

Figure 4:
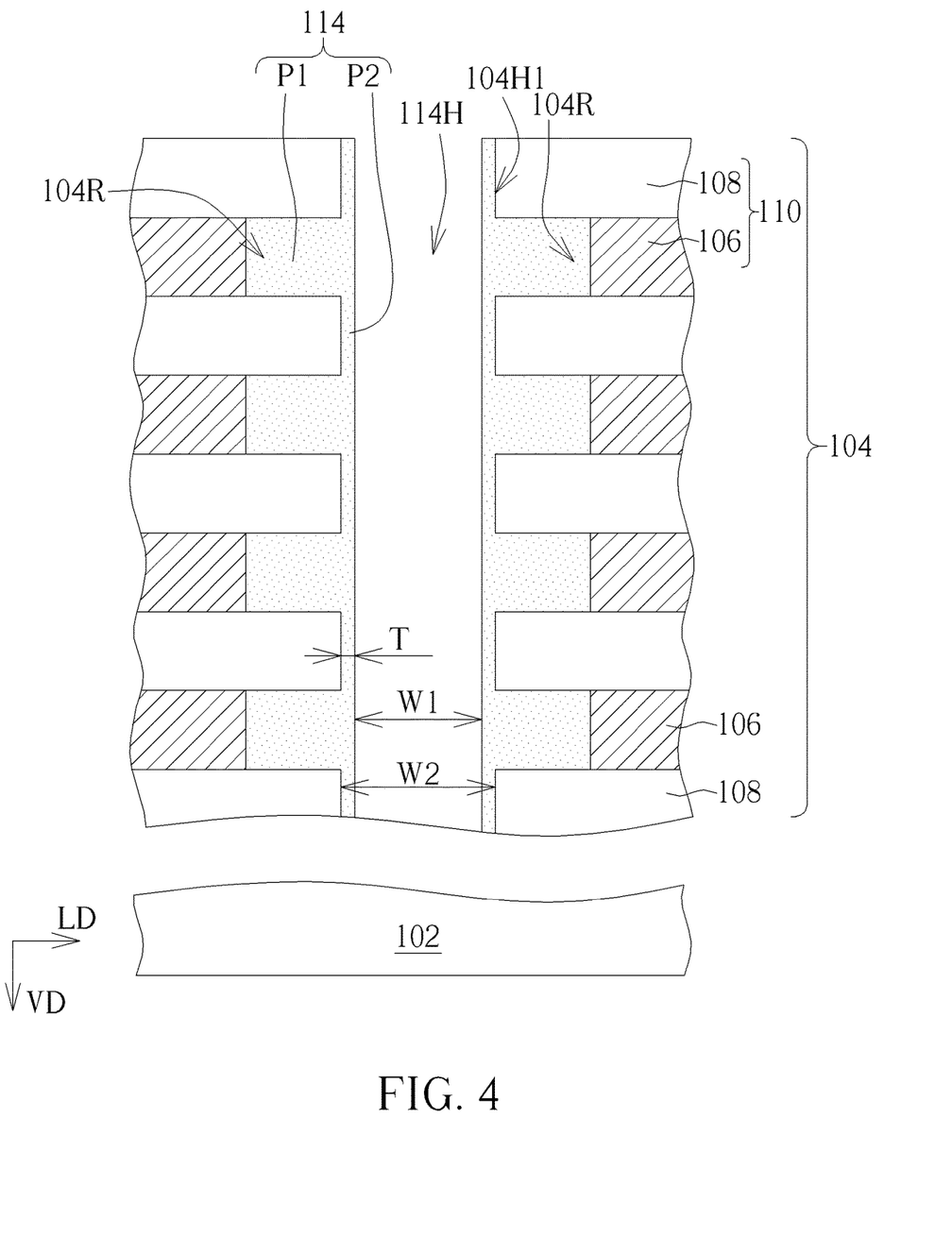

As shown in FIG. 4, an etching stop layer 114 is formed in the channel hole 104H1 and the recesses 104R and followed by patterning the etching stop layer 114 to form a through hole 114H. The etching stop layer 114 may be formed by one or more thin film deposition processes including, but not limited to, CVD, PVD, ALD, or any combination thereof. The etching stop layer 114 may include a material different from the material of the first dielectric layers 106 and the material of the second dielectric layers 108. For example, the etching stop layer 114 may include semiconductor material, such as polysilicon, or other suitable semiconductor material, but not limited thereto. The through hole 114H may extend through the etching stop layer 114 and be formed for example by a photolithography and etching process. A width W1 of the through hole 114H is less than a width W2 of the channel hole 104H1, such that a part of the etching stop layer 114 may remain and extend on sidewalls of the second dielectric layers 108, for example covers the sidewalls of the second dielectric layers 108. Specifically, the patterned etching stop layer 114 may have a plurality of first parts P1 in the recesses 104R and a second part P2 disposed outside the recesses 104R and on the sidewalls of the second dielectric layers 108. Through controlling the width W1 of the through hole 114H, the thickness T of the second part P2 in the lateral direction LD may be adjusted.

As shown in FIG. 5, after the through hole 114H is formed, the patterned etching stop layer 114 outside the recesses 104R (i.e. the second part P2) may be oxidized to form a blocking layer 116, and remaining parts of the etching stop layer 114 may form a plurality of etching stop blocks 114B. Thus, the formed blocking layer 116 may directly contact the etching stop blocks 114B. In some embodiments, the second part P2 may be fully oxidized into the blocking layer 116, and the remaining first parts P1 may form the etching stop blocks 114B, so the formed blocking layer 116 may be disposed on the sidewall of the channel hole 104H1 and contact the sidewalls of the second dielectric layers 108, but the present invention is not limited thereto. In the embodiment of FIG. 5, the blocking layer 116 may be a single layer structure and include an oxide, such as silicon oxide, but not limited thereto. The thickness of the formed blocking layer 116 in the lateral direction LD may be adjusted for example by altering the thickness T of the second part P2. In some embodiments, the blocking layer 116 may be a multilayer structure and include a combination of silicon oxide/silicon nitride/silicon oxide (ONO). In some embodiments, the material of the etching stop blocks 114B may still be the same as the material of the etching stop layer 114.

In some embodiments, the patterned etching stop layer 114 may not include the second part P2 and may form the etching stop blocks 114B. In such situation, the blocking layer 116 may be further formed by one or more thin film deposition processes including, but not limited to, CVD, PVD, ALD, or any combination thereof, and the blocking layer 116 may include insulating material, such as silicon oxide.

As shown in FIG. 6, subsequently, a memory layer 118 and a channel layer 120 may be sequentially formed in the channel hole 104H1, in which the memory layer 118 is disposed between the channel layer 120 and the alternating dielectric stack 104, and one of the etching stop blocks 114B is disposed between the memory layer 118 and a corresponding one of the first dielectric layers 106. The memory layer 118 may be a composite dielectric layer, for example may include the blocking layer 116, a storage layer 122 and a tunneling layer 124. The storage layer 122 and the tunneling layer 124 may be sequentially formed on the blocking layer 116 before forming the channel layer 120, so the blocking layer 116, the storage layer 122, the tunneling layer 124 and the channel layer 120 are sequentially disposed along a direction from the sidewall of the channel hole 104H1 to the center of the channel hole 104H1. The storage layer 122 may include a material for storing charge for memory operation. The material of the storage layer 122 include, but are not limited to, silicon nitride, silicon oxynitride, a combination of silicon oxide and silicon nitride, or any combination thereof. The tunneling layer 124 may include a dielectric material including, but not limited to, silicon oxide, silicon nitride, silicon oxynitride, or any combination thereof. The channel layer 120 may for example include semiconductor materials, such as polysilicon. Electrons or holes from the channel layer 120 can tunnel to the storage layer 122 through the tunneling layer 124. The storage layer 122, the tunneling layer 124 and the channel layer 120 may be formed by one or more thin film deposition processes, such as ALD, CVD, PVD, any other suitable processes, or any combination thereof.

In some embodiments, as shown in FIG. 6, a filling layer 126 may be formed in the channel hole 104H1, thereby forming the channel structure 112. For example, the filling layer 126 may fill in the space at the center of the channel hole 104H1. The filling layer 126 may be formed by depositing a suitable dielectric material on the channel layer 120. The filling layer 126 may include a suitable dielectric material such as silicon oxide and/or organosilicate glass. In some embodiments, the channel structure 112 may not be limited to be the structure shown in FIG. 1 and may include other suitable elements.

Figure 7:
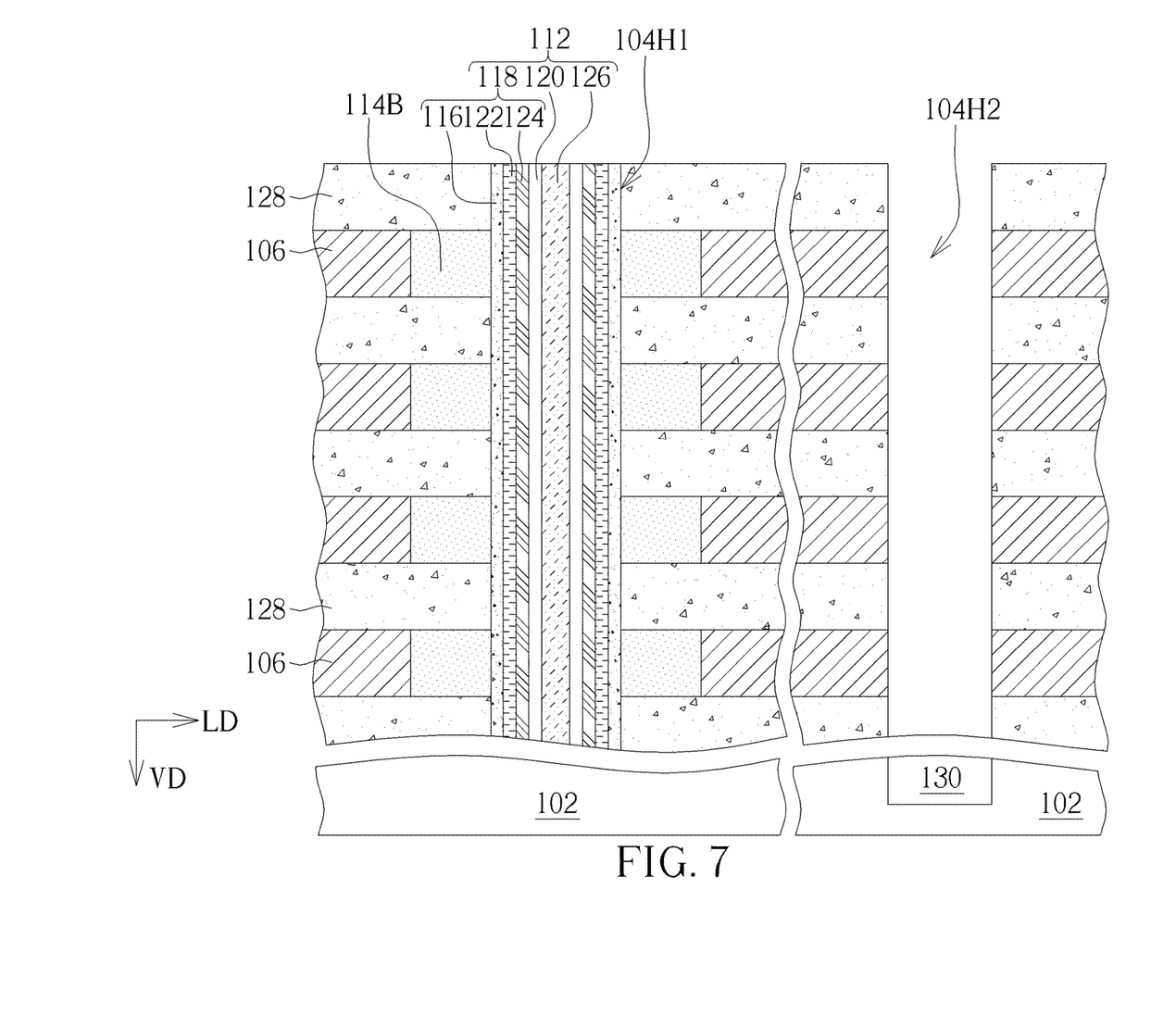

As shown in FIG. 1 and FIG. 7, after the channel structure 112 is formed, the method proceeds to step S16, in which the second dielectric layers 108 are replaced with a plurality of conductive layers 128 by a gate replacement process (also known as the "word line replacement" process). One of the conductive layers 128 may function as a control gate of a memory cell transistor, and the channel structure 112 and the conductive layers 128 may form the vertically-oriented NAND string. In some embodiments, the number of the channel structure 112 may be plural, so that the channel structures 112 and the conductive layers 128 may form plural NAND strings.

In some embodiments, a slit 104H2 may be formed vertically through the alternating dielectric stack 104 before replacing the second dielectric layers 108, so the second dielectric layers 108 may be replaced with the conductive layers 128 through the slit 104H2, but the present invention is not limited thereto. The slit 104H2 may be formed by wet etching and/or dry etching of dielectrics (e.g., silicon oxide and silicon nitride). In some embodiments, after the formation of the slit 104H, a doped region 130 may be formed in substrate 102 under the slit 104H2 by, for example, ion implantation and/or thermal diffusion through the slit 104H2. The doped region 130 may be formed, for example, before replacing the second dielectric layers 108. In some embodiments, the doped region 130 may be formed before the formations of the slit 104H2 and alternating dielectric stack 104.

The replacement of second dielectric layers 108 with the conductive layers 128 may be performed by selectively wet etching second dielectric layers 108 (e.g., silicon nitride) relative to first dielectric layers 106 (e.g., silicon oxide) and filling the space of the removed second dielectric layers 108 with the conductive layers 128 (e.g., tungsten (W)). The conductive layers 128 can be filled by PVD, CVD, ALD, any other suitable process, or any combination thereof. The conductive layers 128 may include conductive materials including, but not limited to, W, Co, Cu, Al, polysilicon, silicides, or any combination thereof.

As shown in FIG. 1 and FIG. 9, the method proceeds to step S18, in which a plurality of air gap layers 134 are formed at least by removing a part of each of the first dielectric layers 106, thereby forming an alternating stack 132. The alternating stack 132 may include the conductive layers 128 and a plurality of air gap layers 134 alternately stacked, in which the air gap layers 134 are formed of air. In this embodiment, as shown in FIG. 8, all the first dielectric layers 106 may be removed by selectively etching the first dielectric layers 106 relative to the conductive layers 128 and the etching stop blocks 114B after the conductive layers 128 are formed. In such situation, since the etching process for the first dielectric layers 106 has an etching rate to the etching stop blocks 114B less or far less than that to the first dielectric layers 106, by means of disposing the etching stop blocks 114B between the blocking layer 116 and the first dielectric layers 106, the etching of the first dielectric layers 106 can be stopped at the etching stop blocks 114B. Also, the blocking layer 116 that may include same material as the first dielectric layers 106 or material with similar etching rate as the first dielectric layers 106 can be avoided damage while removing all the first dielectric layers 106. Accordingly, the etching of the first dielectric layers 106 is easily controlled, and the first dielectric layers 106 can be fully removed. In some embodiments, a part of the first dielectric layers 106 may remain.

As shown in FIG. 9, the etching stop blocks 114B may be removed through the slit 104H2 and the space of the removed first dielectric layers 106 by selectively wet etching the etching stop blocks 114B (e.g. polysilicon) relative to the conductive layers 128 (e.g. W) and the blocking layer 116 (e.g. silicon oxide), so as to form the air gap layers 134 of this embodiment. Accordingly, the alternating stack 132 of this embodiment is formed. The etching process for etching stop blocks 114B may have an etching rate to the etching stop blocks 114B greater or far greater than the conductive layers 128 and the blocking layer 116. For example, the etching stop blocks 114B and the conductive layers 128 may include different materials, such that the conductive layers 128 is not damaged during removing the etching stop blocks 114B.

Since all the etching stop blocks 114B and the entire first dielectric layer 106 between two of the conductive layers 128 are removed, the coupling capacitor between adjacent two of the conductive layers 128 may uses the air gap layer 134 between the two conductive layers 128 as its dielectric medium. Thus, as compared with the capacitor using the first dielectric layer 106 as its dielectric medium, the capacitance of the coupling capacitor between adjacent two conductive layers 128 of this embodiment is significant decreased, thereby reducing the RC delay of the memory transistors and speeding up the operation of the 3D memory device 1. Besides, during programming operation, since the capacitance of the coupling capacitor between adjacent two conductive layers 128 is reduced, the interference between adjacent two conductive layers 128 can be mitigated. With this arrangement, the distance D between adjacent two of the conductive layers 128 may be reduced with the same interference or less interference between adjacent two conductive layers 128, such that the total thickness of the 3D memory device 1 may be decreased.

In some embodiments, as shown in FIG. 9, after the alternating stack 132 is formed, a slit structure 138 may be formed in the slit 104H2 to seal the air gap layers 134. Accordingly, the 3D memory device 1 of this embodiment may be formed. Specifically, the slit structure 138 may include an insulating layer 140 and a contact 142 (such as array common source contact), and the insulating layer 140 is disposed between the contact 142 and the alternating stack 132. The insulating layer 140 may be formed on the sidewall of the slit 104H2, for example, by PVD, CVD, ALD, any other suitable process, or any combination thereof. The contact 142 may be formed in the slit 104H2 after the insulating layer 140 is formed. In some embodiments, the 3D memory device 1 may further include other suitable elements that are not shown in figures.

The 3D memory device and the method for manufacturing the same of the present invention are not limited to the above-mentioned embodiments, and may include different embodiments. In order to simplify the description, the elements of different embodiments and the same elements of the first embodiment will use the same label. In order to compare the difference between the first embodiment and different embodiments, the following contents would focus on the difference between different embodiments and the first embodiment, and the repeated portion will not be redundantly described.

Figure 10:
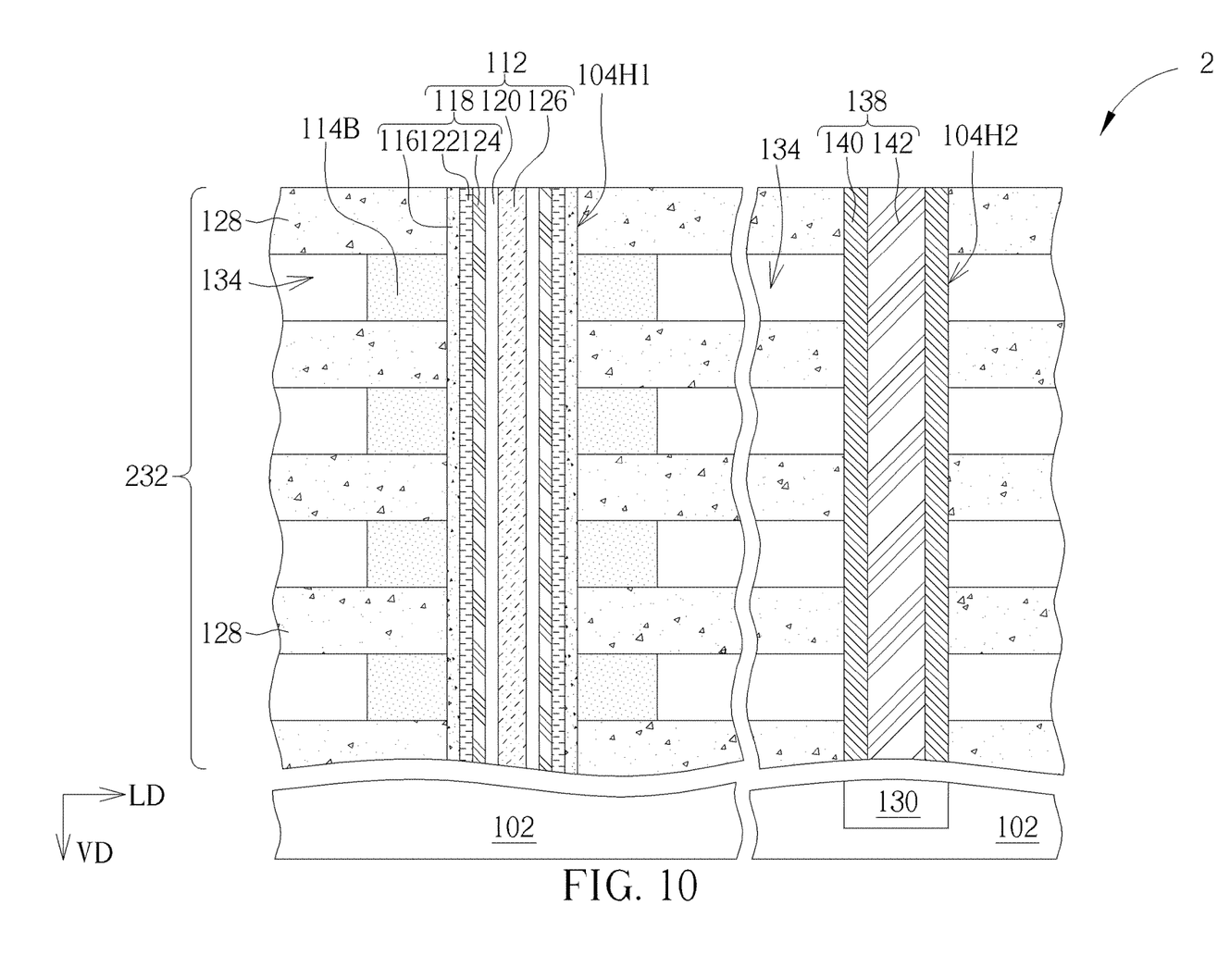
FIG. 10 schematically illustrates a sectional view of an exemplary 3D memory device according to some embodiments of the present invention.

FIG. 10 schematically illustrates a sectional view of an exemplary 3D memory device according to some embodiments of the present invention. For clarity, FIG. 10 only illustrates a part of the 3D memory device instead of entire structure of the 3D memory device, and the present invention is not limited thereto. The method for manufacturing the 3D memory device 2 provided in some embodiments is detailed accompanying with FIG. 1 as well as FIG. 10. It should be understood that the steps shown in the method are not exhaustive and that other steps can be performed as well before, after, or between any of the illustrated steps. As shown in FIG. 1 and FIG. 10, the method of some embodiments is different from the previous embodiment shown in FIGS. 2-9 in that the etching stop blocks 114B may not be removed after removing the first dielectric layers, so the formation of the insulating layer 140 and the contact 142 may be performed after the first dielectric layers are removed. Also, the remaining etching stop blocks 114B may be used to support the conductive layers 128. In such situation, the etching stop blocks 114B may include insulating material for preventing the adjacent conductive layers 128 from being electrically connected, and the insulating material of the etching stop blocks 114B may be different from the insulating material of the first dielectric layer 106 as shown in FIG. 7, such that the etching stop blocks 114B and first dielectric layer 106 may have different etching rate during removing the first dielectric layer 106. In some embodiments, the alternating stack 232 may further include the etching stop blocks 114B between the air gap layers 134 and the channel structure 112, and the etching stop blocks 114B and the blocking layer 116 include different materials. Since the channel structure 112, the slit 104H2, the conductive layers 128, and the slit structure 138 are the same as mentioned in the previous embodiment, the fabrication process for forming the channel structure 112, the slit 104H2, the conductive layers 128, and the slit structure 138 will not be redundantly detailed.

Figure 11:
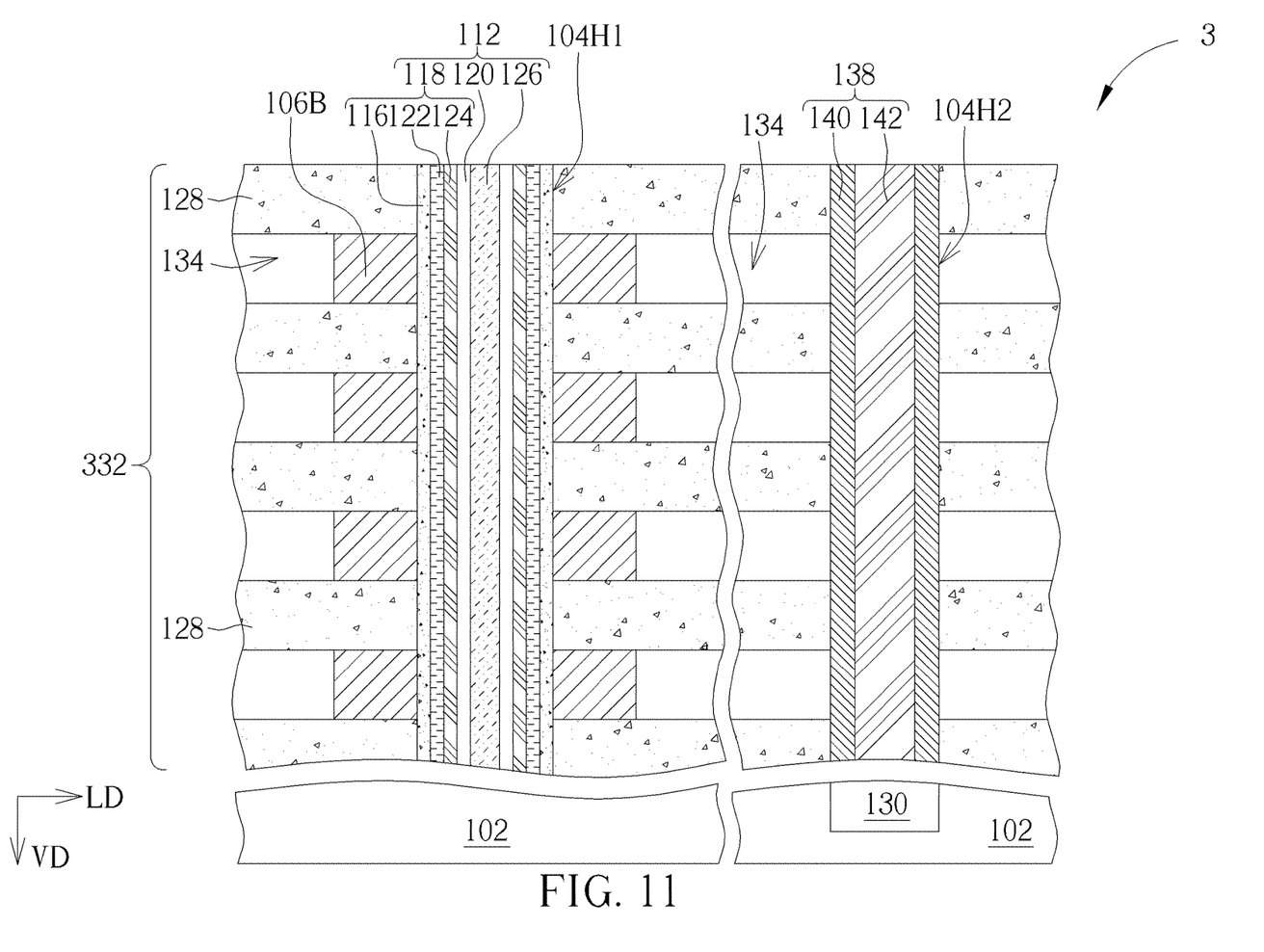
FIG. 11 schematically illustrates a sectional view of an exemplary 3D memory device according to some embodiments of the present invention.

FIG. 11 schematically illustrates a sectional view of an exemplary 3D memory device according to some embodiments of the present invention. For clarity, FIG. 11 only illustrates a part of the 3D memory device instead of entire structure of the 3D memory device, and the present invention is not limited thereto. The method for manufacturing the 3D memory device 3 provided in some embodiments is detailed accompanying with FIG. 1 as well as FIG. 11. It should be understood that the steps shown in the method are not exhaustive and that other steps can be performed as well before, after, or between any of the illustrated steps. As shown in FIG. 1 and FIG. 11, in some embodiments, the recesses 104R shown in FIG. 3 may not be formed, and the channel structure 112 may be formed in the channel hole 104H1 after the channel hole 104H1 is formed. In such situation, the blocking layer 116 may include insulating material, such as silicon oxide, and be formed on the sidewall of the channel hole 104H1 by one or more thin film deposition processes including, but not limited to, CVD, PVD, ALD, or any combination thereof. Since other part of the channel structure 112, the slit 104H2, and the conductive layers 128 are the same as mentioned in the previous embodiment, the fabrication process for forming the channel structure 112, the slit 104H2, and the conductive layers 128 will not be redundantly detailed. In some embodiments, at least another part of each of the first dielectric layers 106 adjacent to the channel structure 112 may remain and form an insulating block 106B, thereby forming the air gap layers 134 after removing a part of each of the first dielectric layers 106 is removed. In such situation, the alternating stack 332 may further include a plurality of insulating blocks 106B disposed between the air gap layers 134 and channel structure 112, so as to prevent the blocking layer 116 from being damaged during removing the part of the first dielectric layers 106. Also, the remaining insulating blocks 106B may be used to support the conductive layers 128. In some embodiments, the insulating blocks and the blocking layer 116 may include a same material, such as silicon oxide. Also, the slit structure 138 may be formed after the alternating stack 332 is formed and may be the same as mentioned in the previous embodiment, so the slit structure 138 will not be redundantly detailed.

By using the disclosed 3D memory device and method for manufacturing the same, each of the air gap layers is formed between any two adjacent conductive layers that serve as control gate of the memory cell transistor, so that the capacitance of the coupling capacitor between adjacent two conductive layers can be reduced, thereby decreasing the RC delay of the memory transistors and speeding up the operation of the 3D memory device. Besides, during programming operation, since the capacitance of the coupling capacitor between adjacent two conductive layers is reduced, the interference between adjacent two conductive layers can be mitigated. With this arrangement, the distance between adjacent two of the conductive layers may be reduced with the same interference or less interference between adjacent two conductive layers, such that the total thickness of the 3D memory device may be decreased.

The foregoing description of the specific embodiments will so fully reveal the general nature of the present invention that others can, by applying knowledge within the skill of the art, readily modify and/or adapt, for various applications, such specific embodiments, without undue experimentation, and without departing from the general concept of the present invention. Therefore, such adaptations and modifications are intended to be within the meaning and range of equivalents of the disclosed embodiments, based on the invention and guidance presented herein. It is to be understood that the phraseology or terminology herein is for the purpose of description and not of limitation, such that the terminology or phraseology of the present specification is to be interpreted by the skilled artisan in light of the invention and guidance.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present invention as contemplated by the inventor(s), and thus, are not intended to limit the present invention and the appended claims in any way.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional (3D) memory device, comprising:
a substrate;
an alternating stack disposed on the substrate, wherein the alternating stack comprises a plurality of conductive layers and a plurality of air gap layers alternately stacked, and the alternating stack comprises a channel hole extending vertically through the alternating stack; and
a channel structure disposed on the substrate, and the channel structure extending vertically through the conductive layers and the air gap layers, wherein the channel structure comprises a blocking layer, a storage layer, a tunneling layer and a channel layer sequentially disposed on a sidewall of the channel hole, the alternating stack further comprises a plurality of etching stop blocks between the air gap layers and the channel structure, and the etching stop blocks and the blocking layer comprise different materials.

2. The 3D memory device according to claim 1, wherein the channel structure further comprises a filling layer disposed in the channel hole.

3. The 3D memory device according to claim 1, wherein the blocking layer directly contacts the etching stop blocks.

4. The 3D memory device according to claim 1, wherein the etching stop blocks comprise polysilicon.

5. The 3D memory device according to claim 1, further comprising a slit structure extending vertically through the alternating stack, wherein the channel structure, the conductive layers and the slit structure seal the air gap layers.

6. The 3D memory device according to claim 5, wherein the slit structure comprises an insulating layer and a contact, and the insulating layer is disposed between the contact and the alternating stack.

7. A method for manufacturing a 3D memory device, comprising:
forming an alternating dielectric stack on a substrate, wherein the alternating dielectric stack comprises a plurality of first dielectric layers and a plurality of second dielectric layers alternately stacked on the substrate, and the plurality of first dielectric layers and the plurality of second dielectric layers comprise different materials;
forming a channel hole vertically through the alternating dielectric stack and forming a plurality of recesses laterally on a sidewall of the channel hole;
forming a plurality of etching stop blocks in the recesses, wherein forming the etching stop blocks comprises:
forming an etching stop layer in the recesses, wherein the etching stop layer extends on a sidewall of each of the second dielectric layers; and
oxidizing the etching stop layer outside the recesses to form a blocking layer, wherein remaining parts of the etching stop layer form the etching stop blocks;
forming a channel structure in the channel hole and vertically through the alternating dielectric stack;
replacing the second dielectric layers with a plurality of conductive layers; and
forming a plurality of air gap layers, thereby forming an alternating stack, wherein the alternating stack comprises the conductive layers and the air gap layers alternately stacked, and the air gap layers are formed at least by removing a part of each of the first dielectric layers.

8. The method for manufacturing the 3D memory device according to claim 7, wherein the etching stop blocks comprise a material different from the first dielectric layers and the second dielectric layers.

9. The method for manufacturing the 3D memory device according to claim 7, wherein the etching stop blocks comprise polysilicon.

10. The method for manufacturing the 3D memory device according to claim 7, wherein forming the channel structure comprises forming a storage layer, a tunneling layer and a channel layer sequentially on the blocking layer.

11. The method for manufacturing the 3D memory device according to claim 7, wherein the etching stop layer and the conductive layers comprise different materials.

12. The method for manufacturing the 3D memory device according to claim 7, wherein forming the air gap layers comprises removing the first dielectric layers.

13. The method for manufacturing the 3D memory device according to claim 12, wherein forming the air gap layers further comprises removing the etching stop blocks.

14. The method for manufacturing the 3D memory device according to claim 7, further comprising forming a slit vertically through the alternating dielectric stack, wherein the second dielectric layers is replaced with the conductive layers through the slit.

15. The method for manufacturing the 3D memory device according to claim 14, further comprising forming an insulating layer in the slit to seal the air gap layers.

16. The method for manufacturing the 3D memory device according to claim 15, further comprising forming a contact in the slit, wherein the insulating layer is disposed between the slit and the alternating stack.

17. The method for manufacturing the 3D memory device according to claim 14, further comprising forming a doped region in the substrate after forming the slit.

* * * * *